United States Patent
Chen et al.

(10) Patent No.: US 9,886,921 B2
(45) Date of Patent: Feb. 6, 2018

(54) GATE DRIVING CIRCUIT, GATE DRIVING METHOD, AND LIQUID CRYSTAL DISPLAY

(71) Applicant: BEIJING BOE OPTOELECTRONICS TECHNOLOGY CO., LTD., Beijing (CN)

(72) Inventors: Xiaochuan Chen, Beijing (CN); Hailin Xue, Beijing (CN); Yanna Xue, Beijing (CN); Yue Li, Beijing (CN); Xuelu Wang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 374 days.

(21) Appl. No.: 14/127,313

(22) PCT Filed: Nov. 15, 2012

(86) PCT No.: PCT/CN2012/084688
§ 371 (c)(1),
(2) Date: Dec. 18, 2013

(87) PCT Pub. No.: WO2014/015580
PCT Pub. Date: Jan. 30, 2014

(65) Prior Publication Data
US 2014/0159997 A1    Jun. 12, 2014

(30) Foreign Application Priority Data

Jul. 24, 2012 (CN) .......................... 2012 1 0258201

(51) Int. Cl.
*G09G 3/36* (2006.01)
*G11C 19/28* (2006.01)
*H03K 17/687* (2006.01)

(52) U.S. Cl.
CPC ......... *G09G 3/3611* (2013.01); *G09G 3/3677* (2013.01); *G11C 19/28* (2013.01);
(Continued)

(58) Field of Classification Search
CPC ............... G09G 3/3611; G09G 3/3677; G09G 2300/0408; G09G 2310/0286;
(Continued)

(56) References Cited

U.S. PATENT DOCUMENTS 8,218,713 B2 * 7/2012 Hsu .......................... G11C 19/28
377/64
8,421,781 B2 * 4/2013 Chen .................... G09G 3/3677
345/100

(Continued)

FOREIGN PATENT DOCUMENTS

CN         102226940 A    10/2011
EP         2400481 A1     12/2011

OTHER PUBLICATIONS

International Preliminary Report on Patentability Appln. No. PCT/CN2012/084688; dated Jan. 27, 2015.

(Continued)

*Primary Examiner* — Sejoon Ahn
(74) *Attorney, Agent, or Firm* — Ladas & Parry LLP (57) ABSTRACT

A gate driving circuit comprises GOA units of multiple stages. Each GOA unit includes a pull-up module and an output module. The pull-up module outputs a second clock signal to the output module when an input signal is at a high level; and the output module is turned on when the second clock signal is at a high level, and outputs a third clock signal as a first gate driving signal and outputs a fourth clock signal as a second gate driving signal when being turned on; the third clock signal and the fourth clock signal have opposite phases but the same cycle, and the cycle of the (Continued)

second clock signal is twice that of the third clock signal. It also discloses a liquid crystal display and a gate driving method, two rows of pixels are driven by one GOA unit, thus the space for disposing TFTs is saved, the sealing area of the LCD is reduced.

15 Claims, 3 Drawing Sheets

(52) U.S. Cl.
CPC . *H03K 17/6871* (2013.01); *G09G 2300/0408* (2013.01); *G09G 2310/0286* (2013.01); *G09G 2310/0291* (2013.01); *G09G 2310/08* (2013.01)

(58) Field of Classification Search
CPC ....... G09G 2310/0291; G09G 2310/08; G11C 19/28; H03K 17/6871
See application file for complete search history.

(56) References Cited

U.S. PATENT DOCUMENTS

| | | | | |
|---|---|---|---|---|
| 2003/0189542 A1* | 10/2003 | Lee | ...................... | G09G 3/3648 345/93 |
| 2005/0201508 A1* | 9/2005 | Shin | ...................... | G09G 3/3677 377/10 |
| 2006/0007085 A1* | 1/2006 | Kim | ...................... | G11C 19/28 345/87 |
| 2006/0139292 A1* | 6/2006 | Yoon | ...................... | G11C 19/00 345/100 |
| 2008/0117157 A1* | 5/2008 | Hwang | ................ | G09G 3/3611 345/92 |
| 2010/0085294 A1* | 4/2010 | Otose | ................... | G09G 3/3677 345/100 |
| 2010/0150302 A1* | 6/2010 | Tsai | ........................ | G11C 19/28 377/79 |
| 2010/0201666 A1* | 8/2010 | Tobita | .................. | G09G 3/3677 345/208 |
| 2010/0245304 A1* | 9/2010 | Umezaki | .................. | G09G 3/20 345/205 |
| 2010/0245337 A1* | 9/2010 | Hu | ........................ | G09G 3/3677 345/213 |
| 2010/0265243 A1* | 10/2010 | Kotani | ................. | G09G 3/3677 345/212 |
| 2011/0002437 A1* | 1/2011 | Su | .......................... | G11C 19/28 377/64 |
| 2011/0316833 A1* | 12/2011 | Chang | .................. | G09G 3/3677 345/211 |
| 2012/0044133 A1* | 2/2012 | Nakamizo | .............. | G11C 19/28 345/100 |
| 2012/0153996 A1* | 6/2012 | Su | ........................ | G09G 3/3659 327/109 |
| 2012/0161842 A1* | 6/2012 | Chen | .................... | G09G 3/3677 327/299 |
| 2014/0035889 A1* | 2/2014 | Huang | ..................... | G09G 3/00 345/204 |
| 2014/0055333 A1* | 2/2014 | Lin | ...................... | G09G 3/3611 345/100 |

OTHER PUBLICATIONS

First Chinese Office Action Appln. No. 201210258201.2; dated Feb. 25, 2015.

Extended European Search Report dated Dec. 23, 2015; Appln. No. 12881530.5-1904/2879126 PCT/CN2012084688.

* cited by examiner

GATE DRIVING CIRCUIT, GATE DRIVING METHOD, AND LIQUID CRYSTAL DISPLAY

TECHNICAL FIELD

The present disclosure relates to the technology of gate driving, and in particular to a gate driving circuit, a gate driving method, and a liquid crystal display (LCD).

BACKGROUND ART

At present, LCDs are commonly used flat panel displays, wherein Thin Film Transistor Liquid Crystal Display (TFT-LCD) is the mainstream product. With the increasingly fierce competition of TFT-LCD products, manufacturers have to reduce costs of products by means of adopting new technologies one after another, so as to enhance market competitiveness of products. The Gate on Array (GOA) technology refers to integrating gate drivers of the TFT-LCD on an array substrate, thus forming scan driving to the panel. As compared with the conventional techniques of Chip On Flex/Film (COF) and Chip On Glass (COG), the GOA technology not only can save costs, but also can achieve symmetry on both sides of the panel, which beautifies the design and leaves out a bonding area and a fan-out wiring space of the gate integrated circuit (Gate IC), thus achieving the design of a narrow frame; meanwhile, since the technique of gate direction bonding can be saved, it also facilitates improving productivity and yield.

Currently, the GOA circuit commonly used in the gate driving circuit adopts a 10T1C mode, in which one GOA unit in the gate driving circuit can drive only one row of gates and ten TFTs are needed to drive each row of gates. However, a display device with a small size will have an extremely small dot pitch under a resolution with a high number of Pixel Per Inch (PPI), less than 30*90 μm sometimes, if ten TFTs are disposed on a space of 90 μm, these ten TFTs need to be arranged in a row, in this way, a quite large sealing area is required.

SUMMARY OF THE INVENTION

In view of the above, a primary object of the present disclosure is to provide a gate driving circuit, a gate driving method, and a display that can reduce the space occupied by the GOA circuit, and thereby reduce the sealing area of the display device.

To achieve the above object, the technical solutions of the present disclosure are implemented as follows:

The present disclosure provides a gate driving circuit comprising GOA units of multiple stages, each of the GOA units including a pull-up module and an output module, the pull-up module for outputting a second clock signal to the output module when an input signal is at a high level; and the output module for being turned on when the second clock signal is at a high level, and outputting a third clock signal as a first gate driving signal and outputting a fourth clock signal as a second gate driving signal when being turned on, wherein the third clock signal and the fourth clock signal have opposite phases but the same cycle, the cycle of the second clock signal is twice that of the third clock signal.

In the above technical solution, the GOA unit further comprises a pull-down module for pulling down voltage of the pull-up module.

In the above technical solution, when the second clock signal changes from a low level to a high level, the third clock signal changes from a low level to a high level and the fourth clock signal changes from a high level to a low level.

In the above technical solution, the pull-up module comprises a first switching device, a boosting device, and a third switching device, wherein the source of the first switching device is taken as an input signal terminal, the gate of the first switching device is connected to the source thereof, and the drain of the first switching device is connected to one end of the boosting device;

the other end of the boosting device is connected to the drain of the third switching device;

the gate of the third switching device is connected to a connection point of the drain of the first switching device and the boosting device, the source of the third switching device is taken as a second clock signal input terminal, the drain of the third switching device is connected to the other end of the boosting device; and a connection point of the boosting device and the drain of the third switching device is taken as an output terminal of the pull-up module, and connected to the output module.

In the above technical solution, the output module comprises a seventh switching device and a tenth switching device; wherein the gate of the seventh switching device is connected to the output terminal of the pull-up module, the source of the seventh switching device is taken as a third clock signal input terminal, and the drain of the seventh switching device is taken as a first gate driving signal output terminal; the gate of the tenth switching device is connected to the output terminal of the pull-up module, the source of the tenth switching device is taken as a fourth clock signal input terminal, and the drain of the tenth switching device is taken as a second gate driving signal output terminal.

In the above technical solution, the output module is further for pulling down the first gate driving signal when the third clock signal changes from a low level to a high level and the fourth clock signal changes from a high level to a low level.

In the above technical solution, the output module further comprises an eleventh switching device, the gate of the eleventh switching device is connected to the fourth clock signal input terminal, the source of the eleventh switching device is connected to the first gate driving signal output terminal, and the drain of the eleventh switching device is connected to a low level terminal.

In the above technical solution, the second clock signals of adjacent GOA units have opposite phases but the same cycle.

The present disclosure also provides a liquid crystal display, comprising the gate driving circuit described above.

The present disclosure also provides a gate driving method, the method comprising:

outputting, by a pull-up module, a second clock signal to an output module when an input signal is at a high level; and turning on the output module when the second clock signal is at a high level, so as to output a third clock signal as a first gate driving signal and output a fourth clock signal as a second gate driving signal, wherein the third clock signal and the fourth clock have opposite phases but the same cycle, and the cycle of the second clock signal is twice that of the third clock signal.

In the above technical solution, when the second clock signal changes from a low level to a high level, the third clock signal changes from a low level to a high level and the fourth clock signal changes from a high level to a low level.

In the above technical solution, after outputting the third clock signal as the first gate driving signal and prior to outputting the fourth clock signal as the second gate driving signal, the method further comprises pulling down, by the output module, the first gate driving signal when the third clock signal changes from a low level to a high level and the fourth clock signal changes from a high level to a low level.

One GOA unit in the gate driving circuit of the present disclosure can output two gate driving signals, thus, two rows of pixels are driven by one GOA unit, as compared with the conventional GOA circuit, less TFTs are required to drive two rows of pixels, thus the space for disposing TFTs is saved, the sealing area of the LCD is reduced, and the narrow frame of the LCD is achieved.

SPECIFIC MODES FOR CARRYING OUT THE INVENTION

With respect to the LCD of the present disclosure, its array substrate comprises p (p is an integer not less than one) data driving lines and q (q is an integer not less than one) gate driving lines, pixels are set on areas where the data driving lines and the gate driving lines are interleaved, that is to say, pixels of p rows and q columns are set on the array substrate of the LCD, a gate driving circuit of the LCD outputs a gate driving signal to the pixels through the gate driving lines, and thereby drives the pixels to open, so that the respective pixels can receive a data signal output by the data driving circuit through the data driving lines, and thereby an image is displayed based on the data signal.

The gate driving circuit of the LCD comprises GOA units of multiple stages, each GOA unit can drive two adjacent rows of pixels, to be specific, the GOA unit of each stage drives two adjacent rows of pixels through two gate driving lines, when the GOA unit outputs a signal at a high level, the corresponding two adjacent rows of pixels are driven to be opened through the corresponding gate driving lines, so that the corresponding two adjacent rows of pixels can receive a data signal; when the GOA unit outputs a signal at a low level, the corresponding two adjacent rows of pixels are closed to stop receiving the data signal. Thus, in one frame of picture, the GOA units of multiple stages in the gate driving circuit output a signal at a high level in sequence, and drive the pixels one by one with two adjacent rows of pixels as a unit.

Each GOA unit has an input signal terminal (INPUT terminal), a reset signal input terminal (RESET input terminal), a low level (VSS) terminal, a first clock signal (CLK1) input terminal, a second clock signal (CLK2) input terminal, a third clock signal (CLK3) input terminal, a fourth clock signal (CLK4) input terminal, a first gate driving signal (OUTPUT_n) output terminal, and a second gate driving signal (OUTPUT_n+1) output terminal, wherein OUTPUT_n is a gate driving signal for the n-th row of pixels, OUTPUT_n+1 is a gate driving signal for the n+1-th row of pixels (n is an integer not less than 1, n is not less than the total number p of rows of pixels, if n is the last row of pixels, then the OUTPUT_n+1 terminal can be useless). The GOA unit of any stage other than the first stage takes an output signal OUTPUT_n−1 of a GOA unit of a previous stage as INPUT, and takes an output signal OUTPUT_n+2 of a GOA unit of a next stage as RESET; in particular, as for the GOA unit of the first stage, it takes an STV signal (frame opening signal) as INPUT, as for the GOA unit of the last stage, usually a dummy GOA unit that is resultant and useless is designed to reset it.

Figure 1:
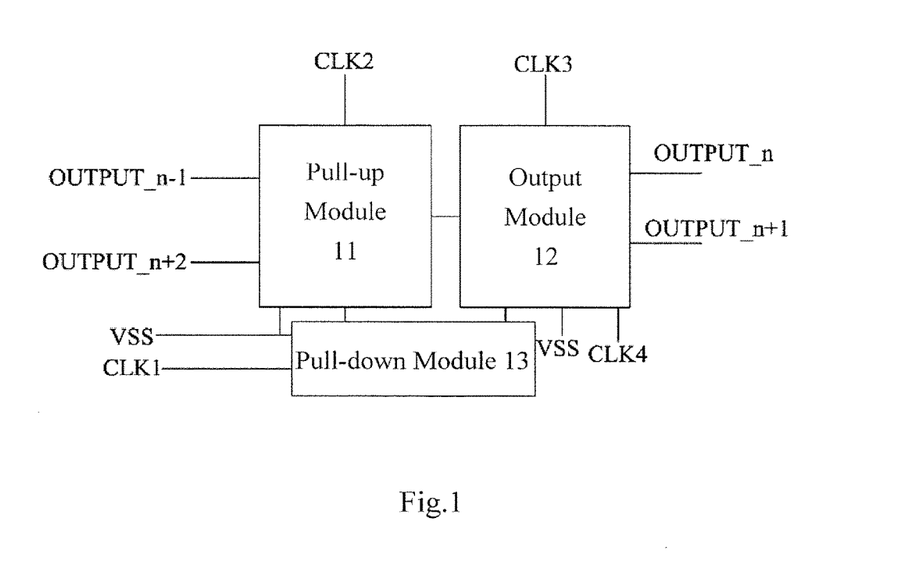
FIG. 1 is a schematic diagram of functional configuration of each GOA unit in a gate driving circuit of the present disclosure.

Specifically, as shown in FIG. 1, the GOA unit of each stage comprises a pull-up module 11 and an output module 12. The pull-up module 11 outputs CLK2 to the output module 12 when INPUT is at a high level, the output module 12 is tuned on when CLK2 is at a high level, and outputs CLK3 as the first gate driving signal (OUTPUT_n), and outputs CLK4 as the second gate driving signal (OUTPUT_n+1) when being turned on, wherein CLK3 and CLK4 have opposite phases but the same cycle.

In addition, the pull-up module 11 is further for, when RESET is at a high level, stopping outputting CLK 2 to the output module 12, so that the output module 12 is able to quickly stop outputting the gate driving signal and complete a reset operation. Thus it can be known that, the output module 12, under the action of the pull-up module 11, can implement normally outputting and completing a shift within one cycle, and also can make the GOA unit reset according to the RESET signal and complete a reset operation in the operating process of the GOA unit.

The GOA unit of each stage further comprises a pull-down module 13 for pulling down voltage of the pull-up module 11, i.e., suppressing noise of the pull-up module 11.

First Embodiment

Figure 2:
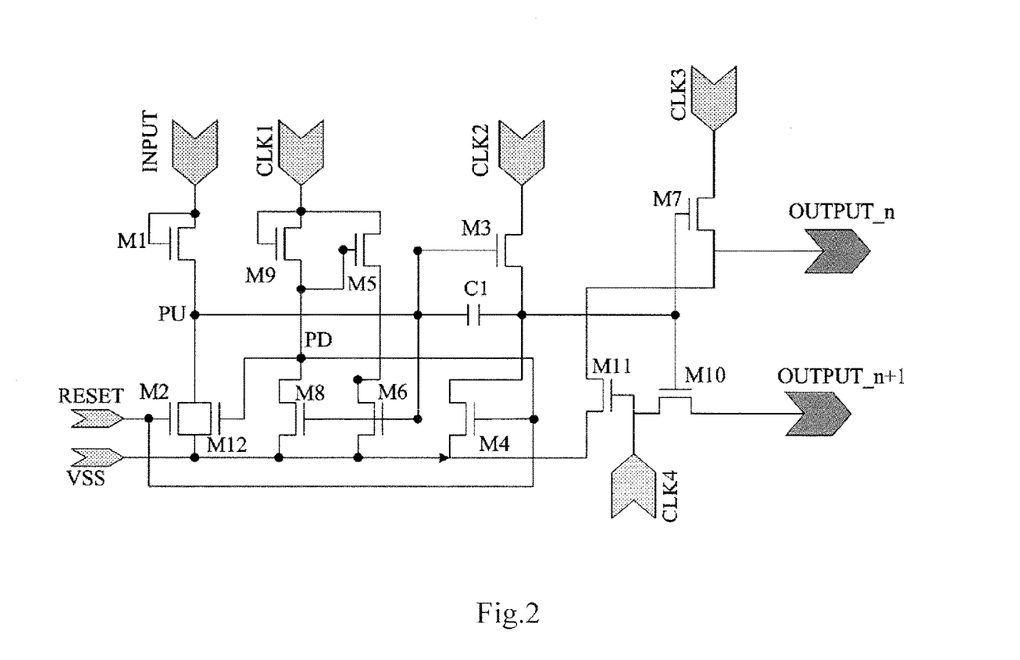
FIG. 2 is a schematic diagram of architecture of specific components of a GOA unit in a gate driving circuit of a first embodiment of the present invention.

In this embodiment, the specific circuit structure of GOA unit of each stage is shown in FIG. 2, wherein the pull-up module 11 comprises a first switching device M1, a second switching device M2, a boosting device C1, and a third switching device M3, the source of M1 is taken as the INPUT terminal, the gate of M1 is connected to the source thereof, and the drain of M1 is connected to the source of M2, a connection point of the drain of M1 and the source of M2 is a pull up (PU) point, the drain of M2 is connected to a low level (VSS) terminal, the gate of M2 is connected to the RESET terminal, one end of the boosting device C1 is connected to the gate of M3 and to the PU point, the other end of C1 is connected to the drain of M3 and taken as an output terminal of the pull-up module 11, the source of M3 is taken as the second clock signal input terminal.

The output module 12 comprises a seventh switching device M7, an eleventh switching device M11, and a tenth switching device M10, wherein the gate of M7 is connected to the output terminal of the pull-up module 11, i.e., being connected to a connection point of C1 and the drain of M3, the source of M7 is taken as the CLK3 input terminal, and the drain of M7 is taken as the OUTPUT_n output terminal; the gate of M10 is connected to the output terminal of the pull-up module 11, i.e., being connected to a connection point of C1 and the drain of M3, the source of M10 is taken as the fourth clock signal input terminal, the drain of M10 is taken as the OUTPUT_n+1 output terminal; the source of M11 is connected to the drain of M7, i.e., being connected to the OUTPUT_n output terminal, the gate of M11 is connected to the source of M10, i.e., being connected to the CLK4 input terminal, and the drain of M11 is connected to the VSS terminal.

The pull-down module 13 comprises a fourth switching device M4, the gate of M4 is connected to the RESET terminal, and the drain of M4 is connected to the drain of M3, i.e., the output terminal of the pull-up module 11, the source of M4 is connected to the VSS terminal. Voltage at the output terminal of the pull-up module 11 is pulled down according to the RESET signal.

The pull-down module 13 may further comprise a fifth switching device M5, a sixth switching device M6, an eighth switching device M8, a ninth switching device M9, and a twelfth switching device M12, wherein the source of M9 is taken as the CLK1 input terminal, the gate of M9 is connected to the source thereof, the drain of M9 is connected to the source of M8 and the gate of M5, this connection point is a pull down (PD) point; the gate of M8 is connected to the gate of M6 and to the PU point, the drain of M8 and the drain of M6 are connected to the VSS terminal, the source of M6 is connected to the drain of M5, and the source of MS is connected to the source of M9.

The source of M12 is connected to the PU point, the gate of M12 is connected to the PD point of the pull-down module, and the drain of M2 and the drain of M12 are connected to the low level (VSS) terminal.

The operating process of the GOA unit described above is as follows: when the gate driving signal output by the GOA unit of a previous stage is OUTPUT_n−1, that is, INPUT of the GOA unit of the current stage is at a high level, M1 is turned on to charge the PU point, C1 further pulls up the voltage at the PU point, i.e., charging the gate of M3, M3 is turned on; thereafter, CLK2 changes from a low level to a high level, since M3 is turned on, a high level signal of CLK2 is transmitted to the gate of M7 and the gate of M10 to make M7 and M10 be turned on, CLK3 is also at a high level, then the drain of M7, i.e., the OUTPUT_n output terminal, outputs CLK3 at a high level, that is, it outputs OUTPUT_n to drive the n-th row of pixels to open; thereafter. CLK3 changes from a high level to a low level, the OUTPUT_n output terminal stops outputting OUTPUT_n, CKL4 changes from a low level to a high level, since M10 is still in a turned-on state, the drain of M10, i.e., the OUTPUT_n+1 output terminal, outputs CKL4 at a high level, that is, it outputs OUTPUT_n+1 to drive the n+1-th row of pixels to open, M11 also is turned on to further pull down the OUTPUT_n output terminal, make the OUTPUT_n output terminal output terminal stop outputting OUTPUT_n, and thereby suppress the noise generated at the OUTPUT_n output terminal in this process. When CLK3 changes from a low level to a high level again and CLK4 changes from a high level to a low level, CLK2 changes from a high level to a low level, M7 and M10 are turned off, the OUTPUT_n output terminal and the OUTPUT_n+1 output terminal are quickly pulled down to stop outputting.

When the GOA unit of a next stage outputs OUTPUT_n+2, that is, the RESET of the GOA unit of the current stage is at a high level, M2 is turned on to discharge the PU point, and pull down the voltage at the PU point, so that the voltage at the gate of M3 is pulled down, M3 is turned off, CLK2 cannot be transmitted to the gate of M7 and the gate of M10, which makes M7 and M10 remain in a turned-off state, the OUTPUT_n output terminal and the OUTPUT_n+1 output terminal of the GOA unit of the current stage stop outputting.

In the above process, when CLK2 changes from a high level to a low level, CLK1 changes from a low level to a high level, M9 is turned on to charge the PD point, the voltage at the PD point is pulled up, M5 is tuned on to charge the PD point to further pull up the voltage at the PD point, which makes M12 and M4 be turned on. M12 discharges the PU point when being turned on, and suppresses the noise generated by the pull-up module 11. M4 discharges the other end of C1, the drain of M3, the gate of M7, and the gate of M10 when being turned on, and suppresses the noise generated by the output module 12. When CLK2 is at a high level, that is, when the GOA unit of the current stage outputs normally, M6 and M8 are also turned on to suppress the noise generated by the pull-up module 11.

Figure 3:
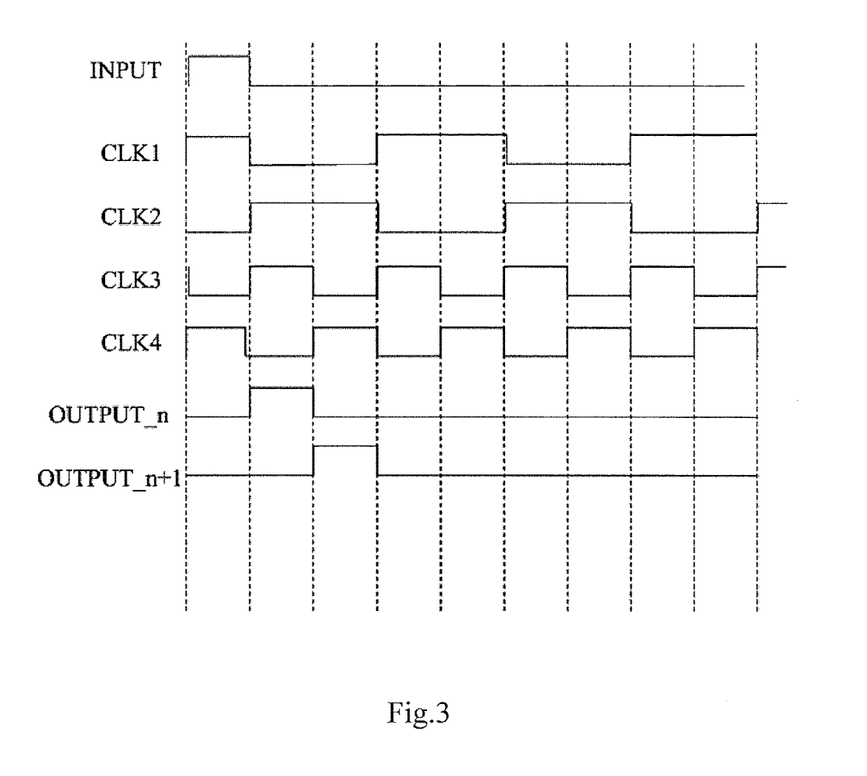
FIG. 3 is a time sequence diagram of input and output signals of a GOA unit in a gate driving circuit of the first embodiment of the present invention.

The time sequence of input and output signals of the GOA unit as described above is as shown in FIG. 3, wherein CLK1 and CLK2 are two clock signals having opposite phases but the same cycle, CLK3 and CLK4 are two clock signals having opposite phases but the same cycle, the cycle of CLK2 is twice that of CLK3, the cycle of CLK4 and CLK3 is the time for which one row of pixels are opened, that is, 1/p of one frame of image, wherein p is the total number of rows of pixels. When CLK2 changes from a low level to a high level, CLK3 changes from a low level to a high level and CLK4 changes from a high level to a low level. In particular, CLK2 of the GOA unit of the current stage is the same as CLK1 of the GOA unit of an adjacent stage, CLK2 of the GOA unit of an adjacent stage is the same as CLK1 of the GOA unit of the current stage. That is, the adjacent GOA units are opposite in phase but the same in cycle in terms of CLK1 or CLK2.

From the above description with respect to the operating process, it can be known that, the function of C1 in the pull-up module 11 is, when CLK2 is at a high level, further pulling up the voltage at the PU point, and thereby reducing noise which is coupled to the PU point by CLK2 via a parasitic capacitor of M3, that is, the noise of the output module 11 will be reduced accordingly. M2 has a function similar to that of M12, it can pull down the voltage at the PU point when RESET is at a high level.

The pull-down module 13 is also optional. M6, M8, M5, and M9 are for controlling the voltage at PD point, the voltage at the PD point controls the turning-on of M12, which further controls to pull down the voltage at the PU point, and thereby accelerates the turning-off of M3, so that the CLK2 high level signal is not output to the output module 12. As will be appreciated that, the voltage at the PD point may be controlled by using other ways, M12 may be also controlled by a separate signal line, as long as the function of pulling down the voltage at the PU point by M12 in this embodiment can be achieved. Meanwhile, the voltage at the PD point also controls the turning-on of M4, which can pull down the voltage input by the pull-up module 11 to the output module 12, and pull down the voltage at the pull-up module 11, that is, it can be also considered as suppressing noise of the output module 12. Of course, M4 in this embodiment may also be controlled to be turned on by the RESET signal. Through the above analysis it can be known that, the pull-down module 13 can be divided into three shunts, that is, a first pull-down shunt M6, M8, M5, M9 and M12, a second pull-down shunt M6, M8, M5, M9 and M4, and a third pull-down shunt M4 (whose gate is connected to RESET), these three shunts may exist separately or in combination.

M11 is also optional in the output module 12. The function of M11 is, under the action of CLK4, further pulling down the OUTPUT_n output terminal, making the OUTPUT_n output terminal stop outputting OUTPUT_n, and thereby suppressing the noise generated by the OUTPUT_n output terminal in this process.

The above M1 to M12 may specifically be Metal-Oxide-Semiconductor Field Effect Transistors (MOSFET). C1 is a capacitor device. Since the manufacturing techniques of a source and a drain of the transistors are the same, the names of the source and the drain are interchangeable, and name change can be made according to the direction of the voltage.

Second Embodiment

Figure 4:
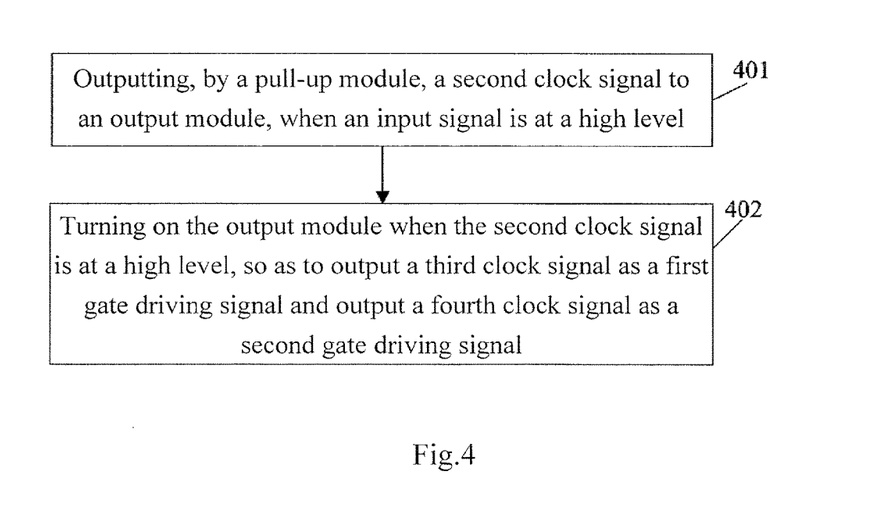
FIG. 4 is a flow chart of implementation of a gate driving method in a second embodiment of the present invention.

This embodiment provides a gate driving method, as shown in FIG. 4, the method may mainly comprise the following steps:

Step 401: outputting, by a pull-up module, a second clock signal to an output module when an input signal is at a high level;

Step 402: turning on the output module when the second clock signal is at a high level, so as to output a third clock signal as a first gate driving signal and output a fourth clock signal as a second gate driving signal.

Herein, the third clock signal and the fourth clock signal have opposite phases but the same cycle, the cycle of the second clock signal is twice that of the third clock signal. In particular, when the second clock signal changes from a low level to a high level, the third clock signal changes from a low level to a high level and the fourth clock signal changes from a high level to a low level.

In the above method, after outputting the third clock signal as the first gate driving signal and prior to outputting the fourth clock signal as the second gate driving signal, the method may further comprise pulling down, by the output module, the first gate driving signal when the third clock signal changes from a low level to a high level and the fourth clock signal changes from a high level to a low level.

Third Embodiment

Figure 5:
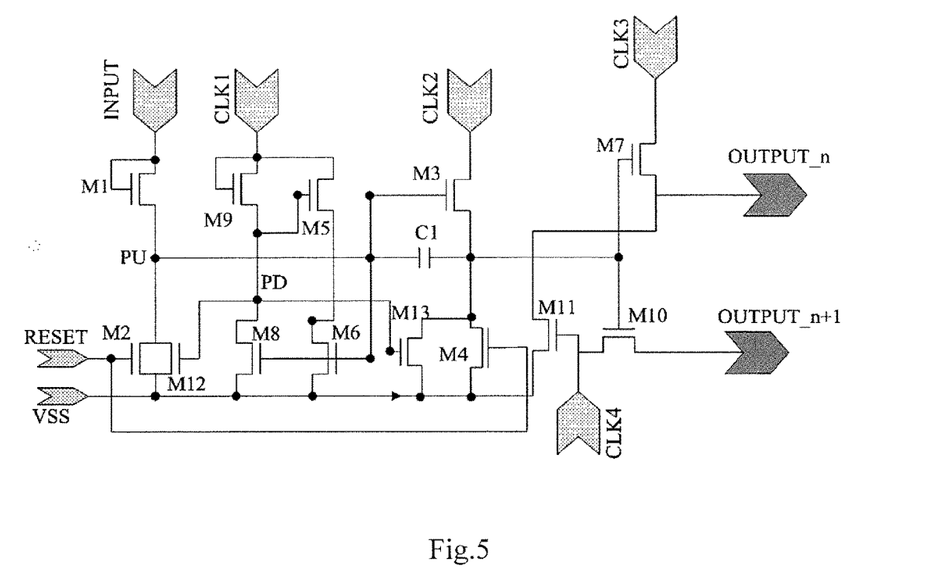
FIG. 5 is a schematic diagram of architecture of specific components of a GOA unit in a gate driving circuit of a third embodiment of the present invention.

In this embodiment, the specific circuit structure of GOA unit of each stage is shown in FIG. 5, its architecture is substantially the same as that in the second embodiment, the difference lies in that a thirteenth switching device M13 is added, the gate of M13 is connected to the PD point, the source of M13 is connected to the output terminal of the pull-up module 11, i.e., being connected to a connection point of C1 and the drain of M3, and the drain of M13 is connected to the VSS terminal; the gate of M4 is connected to the RESET input terminal, the source of M4 is connected to the output of the pull-up module 11, i.e., being connected to a connection point of C1 and the drain of M3, the drain of M4 is connected to the VSS terminal; M4 at this time is controlled separately by the RESET signal, M13 is controlled separately by a voltage signal at the PD point. In this way, M13 pulls down the pull-up module under the control of the PD point, and M4 pulls down the pull-up module under the control of the RESET, which makes M4 and M13 in common accomplish the function of M4 in the first embodiment, that is, M4 in the first embodiment does not need to be always in an operating status, which facilitates extending a service life.

Fourth Embodiment

Figure 6:
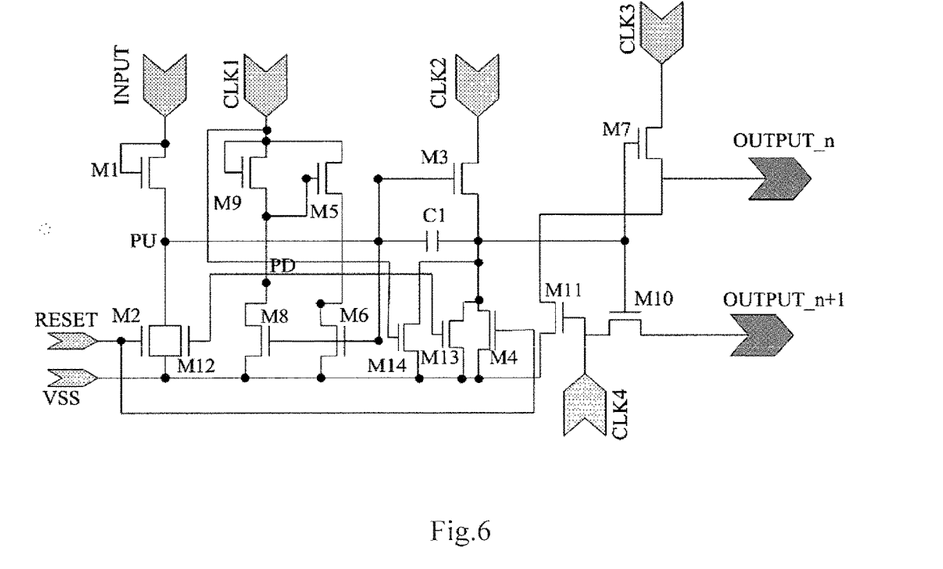
FIG. 6 is a schematic diagram of architecture of specific components of a GOA unit in a gate driving circuit of a fourth embodiment of the present invention.

In this embodiment, the specific circuit structure of GOA unit of each stage is shown in FIG. 6, its architecture is substantially the same as the GOA unit in the third embodiment, the difference lies in that a fourteenth switching device M14 is added additionally in the pull-down module, the gate of M14 is connected to the CLK1 input terminal, the source of M14 is connected to the output terminal of the pull-up module 11, that is, being connected to a connection point of C1 and the drain of M3, and the drain of M14 is connected to the VSS terminal, in this way, when CLK1 is at a high level, M14 can further pull down the pull-up module, and thereby further improve the noise elimination capability of the GOA unit.

In the prior art, one GOA unit can drive only one row of pixels, the space required to dispose TFT is relatively large; while in the gate driving circuit of the present disclosure, one GOA unit can drive two rows of pixels, which is implemented requiring less TFTs as compared with the prior art, thus the space for disposing TFTs is saved, the sealing area is reduced, and the narrow frame of the LCD is achieved.

The above described are merely preferred embodiments of the present invention, they are not intended to limit the scope of the present invention.

Explanation of Reference signs: M1, a first TFT switching device; M2, a second TFT switching device; M3, a third TFT switching device; M4, a fourth TFT switching device; M5, a fifth TFT switching device; M6, a sixth TFT switching device; M7, a seventh TFT switching device; M8, an eighth TFT switching device; M9, a ninth TFT switching device; M10, a tenth TFT switching device; M11, an eleventh TFT switching device; M12, a twelfth TFT switching device; M13, a thirteenth TFT switching device; M14, a fourteenth TFT switching device; C1, a boosting device; 11, a pull-up module; 12, an output module; and 13, a pull-down module.

The invention claimed is:

1. A gate driving circuit comprising gate driver on array (GOA) units of multiple stages, each of the GOA units comprising:

a pull-up circuit for outputting a second clock signal which is input from a second clock signal terminal to an output circuit when an input signal is at a high level; and the output circuit for being turned on when the second clock signal is at a high level, and outputting a third clock signal which is input from a third clock signal terminal as a first gate driving signal and outputting a fourth clock signal which is input from a fourth clock signal terminal as a second gate driving signal when being turned on, wherein the third clock signal and the fourth clock signal have opposite phases but the same cycle, the cycle of the second clock signal is twice that of the third clock signal, and wherein the output circuit comprises a seventh switching device, a tenth switching device, and an eleventh switching device, wherein the gate of the seventh switching device is connected to the output terminal of the pull-up circuit, the source of the seventh switching device is taken as a third clock signal input terminal, and the drain of the seventh switching device is taken as a first gate driving signal output terminal, the gate of the tenth switching device is connected to the output terminal of the pull-up circuit, the source of the tenth switching device is taken as a fourth clock signal input terminal, and the drain of the tenth switching device is taken as a second gate driving signal output terminal, and the gate of the eleventh switching device is connected to the fourth clock signal input terminal, the source of the eleventh switching device is connected to the first gate driving signal output terminal, and the drain of the eleventh switching device is connected to a low level terminal.

2. The gate driving circuit according to claim 1, wherein the GOA unit further comprises a pull-down circuit for pulling down voltage of the pull-up circuit.

3. The gate driving circuit according to claim 1, wherein, when the second clock signal changes from a low level to a high level, the third clock signal changes from a low level to a high level and the fourth clock signal changes from a high level to a low level.

4. The gate driving circuit according to claim 1, wherein the pull-up circuit comprises a first switching device, a boosting device, and a third switching device; wherein,
the source of the first switching device is taken as an input signal terminal, the gate of the first switching device is connected to the source thereof, and the drain of the first switching device is connected to one end of the boosting device;
the other end of the boosting device is connected to the drain of the third switching device;
the gate of the third switching device is connected to a connection point of the drain of the first switching device and the boosting device, the source of the third switching device is taken as a second clock signal input terminal, the drain of the third switching device is connected to the other end of the boosting device; and
a connection point of the boosting device and the drain of the third switching device is taken as an output terminal of the pull-up circuit, and connected to the output circuit.

5. The gate driving circuit according to claim 1, wherein the output circuit is further for pulling down the first gate driving signal when the third clock signal changes from a high level to a low level and the fourth clock signal changes from a low level to a high level.

6. The gate driving circuit according to claim 1, wherein the second clock signals of adjacent GOA units have opposite phases but the same cycle.

7. A gate driving method for the gate driving circuit according to claim 1, comprising:
outputting, by a pull-up circuit, a second clock signal to an output circuit when an input signal is at a high level; and
turning on the output circuit when the second clock signal is at a high level so as to output a third clock signal as a first gate driving signal and output a fourth clock signal as a second gate driving signal,
the third clock signal and the fourth clock have opposite phases but the same cycle, and the cycle of the second clock signal is twice that of the third clock signal.

8. The gate driving method according to claim 7, wherein when the second clock signal changes from a low level to a high level, the third clock signal changes from a low level to a high level and the fourth clock signal changes from a high level to a low level.

9. The gate driving method according to claim 7, wherein after outputting the third clock signal as the first gate driving signal and prior to outputting the fourth clock signal as the second gate driving signal, the method further comprises pulling down, by the output circuit, the first gate driving signal when the third clock signal changes from a low level to a high level and the fourth clock signal changes from a high level to a low level.

10. A liquid crystal display comprising a gate driving circuit, the gate driving circuit comprising gate driver on array (GOA) units of multiple stages, each of the GOA units comprising:
a pull-up circuit for outputting a second clock signal which is input from a second clock signal terminal to an output circuit when an input signal is at a high level; and the output circuit for being turned on when the second clock signal is at a high level, and outputting a third clock signal which is input from a third clock signal terminal as a first gate driving signal and outputting a fourth clock signal which is input from a fourth clock signal terminal as a second gate driving signal when being turned on,
wherein the third clock signal and the fourth clock signal have opposite phases but the same cycle, the cycle of the second clock signal is twice that of the third clock signal, and
wherein the output circuit comprises a seventh switching device, a tenth switching device, and an eleventh switching device, wherein the gate of the seventh switching device is connected to the output terminal of the pull-up circuit, the source of the seventh switching device is taken as a third clock signal input terminal, and the drain of the seventh switching device is taken as a first gate driving signal output terminal, the gate of the tenth switching device is connected to the output terminal of the pull-up circuit, the source of the tenth switching device is taken as a fourth clock signal input terminal, and the drain of the tenth switching device is taken as a second gate driving signal output terminal, and the gate of the eleventh switching device is connected to the fourth clock signal input terminal, the source of the eleventh switching device is connected to the first gate driving signal output terminal, and the drain of the eleventh switching device is connected to a low level terminal.

11. The liquid crystal display according to claim 10, wherein the GOA unit further comprises a pull-down circuit for pulling down voltage of the pull-up circuit.

12. The liquid crystal display according to claim 10, wherein, when the second clock signal changes from a low level to a high level, the third clock signal changes from a low level to a high level and the fourth clock signal changes from a high level to a low level.

13. The liquid crystal display according to claim 10, wherein the pull-up circuit comprises a first switching device, a boosting device, and a third switching device; wherein,
the source of the first switching device is taken as an input signal terminal, the gate of the first switching device is connected to the source thereof, and the drain of the first switching device is connected to one end of the boosting device;
the other end of the boosting device is connected to the drain of the third switching device;
the gate of the third switching device is connected to a connection point of the drain of the first switching device and the boosting device, the source of the third switching device is taken as a second clock signal input terminal, the drain of the third switching device is connected to the other end of the boosting device; and
a connection point of the boosting device and the drain of the third switching device is taken as an output terminal of the pull-up circuit, and connected to the output circuit.

14. The liquid crystal display according to claim 10, wherein the output circuit is further for puffing down the first gate driving signal when the third clock signal changes from a high level to a low level and the fourth clock signal changes from a low level to a high level.

15. The liquid crystal display according to claim 12, wherein the second clock signals of adjacent GOA units have opposite phases but the same cycle.

\* \* \* \* \*